(12) United States Patent
Trenkler et al.

(10) Patent No.: US 9,910,193 B2
(45) Date of Patent: *Mar. 6, 2018

(54) REFLECTIVE OPTICAL ELEMENT AND EUV LITHOGRAPHY APPLIANCE

(71) Applicant: Carl Zeiss SMT GmbH, Oberkochen (DE)

(72) Inventors: Johann Trenkler, Schwaebisch Gmuend (DE); Hans-Juergen Mann, Oberkochen (DE); Udo Nothelfer, Radebeul (DE)

(73) Assignee: Carl Zeiss SMT GmbH, Oberkochen (DE)

( * ) Notice: Subject to any disclaimer, the term of this patent is extended or adjusted under 35 U.S.C. 154(b) by 205 days.

This patent is subject to a terminal disclaimer.

(21) Appl. No.: 14/529,515

(22) Filed: Oct. 31, 2014

(65) Prior Publication Data

US 2015/0055111 A1 Feb. 26, 2015

Related U.S. Application Data

(63) Continuation of application No. 13/939,346, filed on Jul. 11, 2013, now Pat. No. 8,891,163, which is a
(Continued)

(30) Foreign Application Priority Data

Mar. 3, 2003 (DE) .................................. 103 09 084

(51) Int. Cl.
 *G02B 5/08* (2006.01)
 *B82Y 10/00* (2011.01)
 (Continued)

(52) U.S. Cl.
 CPC ............ *G02B 5/0891* (2013.01); *B82Y 10/00* (2013.01); *G02B 5/085* (2013.01); *G02B 5/0816* (2013.01);
 (Continued)

(58) Field of Classification Search
 None
 See application file for complete search history.

(56) References Cited

U.S. PATENT DOCUMENTS

| 4,958,363 A | 9/1990 | Nelson et al. |
| 5,958,605 A | 9/1999 | Montcalm et al. |

(Continued)

FOREIGN PATENT DOCUMENTS

| EP | 0 708 367 | 4/1996 |
| EP | 0 922 996 | 6/1999 |

(Continued)

OTHER PUBLICATIONS

D.E. Aspnes, "Optical Functions of Intrinsic Si: General Remarks", *Properties of Silicon*, EMIS Datareviews Series No. 4, published by INSPEC, The Institution of Electrical Engineers (1988), Chapter 2, pp. 59-81 (Nov. 1987) EMIS Datareview RN=17801.

(Continued)

*Primary Examiner* — Derek S Chapel
(74) *Attorney, Agent, or Firm* — Fish & Richardson P.C.

(57) ABSTRACT

A reflective optical element and an EUV lithography appliance containing one such element are provided, the appliance displaying a low propensity to contamination. The reflective optical element has a protective layer system includes at least two layers. The optical characteristics of the protective layer system are between those of a spacer and an absorber, or correspond to those of a spacer. The selection of a material with the smallest possible imaginary part and a real part which is as close to 1 as possible in terms of the refractive index leads to a plateau-type reflectivity course according to the thickness of the protective layer system between two thicknesses $d_1$ and $d_2$. The thickness of the protective layer system is selected in such a way that it is less than $d_2$.

25 Claims, 6 Drawing Sheets

Related U.S. Application Data continuation of application No. 13/530,192, filed on Jun. 22, 2012, now Pat. No. 8,537,460, which is a continuation of application No. 13/118,028, filed on May 27, 2011, now Pat. No. 8,243,364, which is a continuation of application No. 12/399,775, filed on Mar. 6, 2009, now Pat. No. 7,952,797, which is a continuation of application No. 11/216,560, filed on Aug. 31, 2005, now abandoned, which is a continuation-in-part of application No. PCT/EP2004/002014, filed on Mar. 1, 2004.

(51) Int. Cl.
*G03F 7/20* (2006.01)
*G21K 1/06* (2006.01)

(52) U.S. Cl.
CPC ........ *G03F 7/7015* (2013.01); *G03F 7/70916* (2013.01); *G03F 7/70958* (2013.01); *G21K 1/062* (2013.01)

(56) References Cited

U.S. PATENT DOCUMENTS

| | | | |
|---|---|---|---|
| 6,157,486 A | 12/2000 | Benson et al. | |
| 6,228,512 B1 | 5/2001 | Bajt et al. | |
| 6,449,086 B1 | 9/2002 | Singh | |
| 6,643,353 B2* | 11/2003 | Verman | G21K 1/062 378/84 |
| 6,937,334 B2 | 8/2005 | Monshouwer et al. | |
| 7,952,797 B2 | 5/2011 | Trenkler et al. | |
| 8,121,254 B2 | 2/2012 | Murakami et al. | |
| 8,243,364 B2 | 8/2012 | Trenkler et al. | |
| 8,891,163 B2* | 11/2014 | Trenkler | B82Y 10/00 359/359 |
| 2003/0064161 A1* | 4/2003 | Malinowski | G02B 27/0006 427/402 |
| 2004/0011381 A1 | 1/2004 | Klebanoff et al. | |
| 2004/0101710 A1* | 5/2004 | Prisbrey | B82Y 10/00 428/670 |
| 2005/0087699 A1 | 4/2005 | Miyake | |
| 2005/0276988 A1 | 12/2005 | Trenkler | |
| 2006/0076516 A1 | 4/2006 | Wedowski | |
| 2006/0192158 A1* | 8/2006 | Wedowski | B08B 7/0035 250/504 R |
| 2006/0245057 A1 | 11/2006 | Van Herpen et al. | |
| 2007/0054497 A1 | 3/2007 | Weiss et al. | |
| 2008/0204861 A1 | 8/2008 | Shiraishi | |

FOREIGN PATENT DOCUMENTS

| | | |
|---|---|---|
| EP | 0 824 721 | 7/2000 |
| EP | 1 186 957 | 3/2002 |
| EP | 1 260 861 | 11/2002 |
| EP | 1 065 568 | 9/2007 |
| JP | 2-19850 | 1/1990 |
| WO | 99/24851 | 5/1999 |
| WO | 00/73823 | 12/2000 |
| WO | 03/032329 | 4/2003 |
| WO | 03/081187 | 10/2003 |

OTHER PUBLICATIONS

S. Bajit et al., "Improved Reflectance and Stability of Mo/Si Multilayers", *Information Bridge, DOE Scientific and Technical Information*, Document No. 802924/UCRL-JC-145925 (Oct. 22, 2001).

E. Hecht, "The Propagation of Light", *Optics*, Chapter 4, pp. 79-127, Copyright by the Addison-Wesley Publishing Company, Reprinted with correction Apr. 1988.

C.M. Herzinger et al., "Ellipsometric determination of optical constants for silicon and thermally grown silicon dioxide via a multi-sample, multi-wavelength, multi-angle investigation", *Journal of Applied Physics*, vol. 83, No. 6, pp. 3323-3336 (Mar. 15, 1998).

Robert Hull, Editor, *Properties of Crystalline Silicon*, published by: INSPEC, The Institution of Electrical Engineers, London, UK (1999), authored by D.E. Aspnes, "Optical Properties of c-Si: general aspects", Chapter 12.1, pp. 679-682 (Mar. 1998); D.E. Aspnes, "Optical functions of intrinsic c-Si for photon energies up to 7.5 eV: table", Chapter 12.2, pp. 683-690 (Mar. 1998); D.E. Aspnes, Optical functions of intrinsic c-Si for selected photon energies: table, Chapter 12.3, pp. 691-695 (Mar. 1998); and D.E. Aspnes, "Optical functions of liquid Si", Chapter 12.4, pp. 696 (Mar. 1998).

Rei Kitamura et al., "Optical constants of silica glass from extreme ultraviolet to far infrared at near room temperature", *Applied Optics*, vol. 46, No. 33, pp. 8118-8133 (Nov. 20, 2007).

Malinowski et al., "Controlling Contamination in Mo/Si Multilayer Mirrors by Si Surface-capping Modification", *Proceedings of SPIE*, vol. 4688, pp. 442-453 (2002).

Oesterreich et al.: "Multilayer reflectance during exposure to EUV radiation, Soft X-Ray and EUV Imaging Systems", *SPIE* vol. 4146, XP002289630, pp. 64-71, (2000).

Edward D. Palik, Editor, *Handbook of Optical Constants of Solids*, published by Academic Press, Inc. (1985), authored by H. R. Philipp, Silicon Dioxide ($SiO_2$) (Glass), pp. 749-763 (1985).

M. Singh and J.M. Brant "Capping layers for extreme-ultraviolet multilayer interference coatings" *Optics Letters*, vol. 26, No. 5, pp. 259-261 (Mar. 1, 2001).

Guo-Long Tan et al., "Optical Properties and London Dispersion Forces of Amorphous Silica Determined by Vacuum Ultraviolet Spectroscopy and Spectroscopic Ellipsometry", *Journal of American Ceramic Society*, vol. 86, No. 11, pp. 1885-1892 (2003).

Pragya Tripathi et al., "Optical constants of silicon and silicon dioxide using soft X-ray reflectance measurements", *Optics Communications*, vol. 211, pp. 215-223 (Oct. 1, 2002).

J.H. Underwood et al., "Tarnishing of Mo/Si multilayer x-ray mirrors", *Applied Optics*, vol. 32, No. 34, pp. 6985-6990 (Dec. 1, 1993).

\* cited by examiner

REFLECTIVE OPTICAL ELEMENT AND EUV LITHOGRAPHY APPLIANCE

CROSS-REFERENCE TO RELATED APPLICATIONS

This is a Continuation Application of application Ser. No. 13/939,346, filed on Jul. 11, 2013, which is a Continuation Application of application Ser. No. 13/530,192, filed on Jun. 22, 2012, now U.S. Pat. No. 8,537,460, which is a Continuation Application of application Ser. No. 13/118,028, filed on May 27, 2011, now U.S. Pat. No. 8,243,364, which is a Continuation Application of application Ser. No. 12/399,775 filed Mar. 6, 2009, now U.S. Pat. No. 7,952,797, which is a Continuation Application of application Ser. No. 11/216,560 filed Aug. 31, 2005, which is a Continuation-in-Part Application of PCT Application No. PCT/EP2004/002014 filed Mar. 1, 2004 and published as WO 2004/079753 on Sep. 16, 2004, which claims priority from German Application No. 103 09 084.3 filed Mar. 3, 2003. The entire disclosures of the prior applications are hereby incorporated by reference.

FIELD OF THE INVENTION

The invention concerns a reflective optical element for the EUV and soft X-ray wavelength region, having a multilayer system and a protective layer system, wherein the side of the multilayer system facing the protective layer system terminates in an absorber layer. Furthermore, the invention concerns an EUV lithography appliance with a reflective optical element of this kind.

BACKGROUND OF THE INVENTION

Multilayers are composed of periodic repetitions, and in the most simple case a period consists of two layers. The one layer material should consist of a so-called spacer material, while the other layer material should consist of a so-called absorber material. Spacer material has a real part of the refractive index close to 1, absorber material has a real part of the refractive index significantly different from 1. The period thickness and the thicknesses of the individual layers are chosen in dependence on the operating wavelength, so that the reflectivity is generally maximized at this operating wavelength.

Depending on the requirement of the reflective optical element in regard to the reflection profile, various configurations of the multilayer system are conceivable. Bandwidth and reflectivity, for example, can be adjusted by having more than just two materials in one period or by deviating from a constant layer thickness or even from constant thickness ratios (so-called depth-graded multilayers).

EUV lithography appliances are used in the production of semiconductor components, such as integrated circuits. Lithography appliances which are used in the extreme ultraviolet wavelength region primarily have multilayer systems of molybdenum and silicon, for example, as the optical reflective element. Although EUV lithography appliances have a vacuum or a residual gas atmosphere in their interior, it is not entirely possible to prevent hydrocarbons and/or other carbon compounds from being inside the appliance. These carbon compounds are split apart by the extreme ultraviolet radiation or by secondary electrons; resulting in the depositing of a carbon-containing contamination film on the optical elements. This contamination with carbon compounds leads to substantial reflection losses of the functional optical (surfaces, which can have a considerable influence on the economic effectiveness of the EUV lithography process. This effect is intensified in that typical EUV lithography appliances have eight or more reflective optical elements. Their transmission is proportional to the product of the reflectivities of the individual optical reflective elements.

The contamination leads not only to reflectivity losses, but also to imaging errors, which in the worst case make an imaging impossible. Thus, cleaning cycles have to be provided when operating an EUV lithography appliance or when using reflective optical elements. These significantly increase the operating costs. But the cleaning cycles not only increase the down time, but also entail the risk of worsening of the homogeneity of the layer thickness of the reflective optical elements and the risk of increasing the surface relief, which leads to further reflectivity losses.

One approach to controlling the contamination for Mo/Si multilayer mirrors is found in M. Malinowski et al., Proceedings of SPIE Vol. 4688 (2002), pages 442 to 453. A multilayer system of 40 pairs of molybdenum and silicon with pair thickness of 7 nm and a $\Gamma=(d_{Mo}/(d_{Mo}+d_{Si})$, with $d_{Mo}$ being the thickness of the molybdenum layer and $d_{Si}$ the thickness of the silicon layer, of around 0.4, was provided with an additional silicon layer on the uppermost molybdenum layer. Multilayer systems with different thickness of silicon protective layer were measured, extending from 2 to 7 nm. Traditional Mo/Si multilayer systems have a silicon protective layer of 4.3 nm, which helps protect against contamination, although it very quickly becomes oxidized. The measurements revealed that there is a reflectivity plateau for a silicon protective layer of 3 nm, depending on the radiation dose. It is therefore recommended to use silicon protective layers with a thickness of 3 nm, instead of silicon protective layers with a thickness of 4.3 nm. For a longer operating time can be achieved with a silicon protective layer 3 nm in thickness, for the same tolerance in the reflectivity loss.

SUMMARY OF THE INVENTION

The problem of the present invention is to provide a reflective optical element for the EUV and soft X-ray wavelength region that has the longest possible lifetime. Furthermore, the problem of the invention is to provide an EUV lithography appliance with the shortest possible down time.

The problem is solved by a reflective optical element, as well as an EUV lithography appliance according to the claims.

It has been found that reflective optical elements for the EUV and soft X-ray wavelength region with long lifetime are achieved if they are provided with a protective layer system that has one or more layers of materials with a particular refractive index, and in which the overall thickness of the protective layer system is chosen according to particular criteria. The one or more layers of the protective layer system should have a refractive index at operating wavelengths between 12.5 nm and 15 nm whose real part is between 0.90 and 1.03, preferably between 0.95 and 1.02, and whose imaginary part is between 0 and 0.025, especially preferably between 0 and 0.015. Thus, as compared to the layers of the multilayer system situated underneath, the layers of the protective layer system have the optical properties of a spacer or lie between those of a spacer and an absorber. The choice of a material with the smallest, possible imaginary part and a real part as close as possible to 1 results in a plateau-shaped reflectivity curve, depending on the thickness of the protective layer system between two thicknesses $d_1$ and $d_2$. This means that, with these selected materials, the reflective optical element made of a multilayer system and a protective layer system is insensitive to fluctuations in the thickness of the protective layer system in a particular region. According to the invention, the reflective optical element has a protective layer system with a thickness smaller than $d_2$.

The reflective optical elements of the invention have the benefit that their relative insensitivity to thickness variations in the protective layer system also translates into an insensitivity to the build-up of a contamination layer. Without substantial change in reflectivity, much thicker carbon layers can be tolerated than with traditional reflective optical elements. This also has a positive impact on the homogeneity of the imaging, since even thickness fluctuations over the entire area are negligible.

Basically, for a given operating wavelength, one will select the material, the layer makeup of the protective layer system, and the individual layer thicknesses so that a plateau in the reflectivity is formed between two thicknesses $d_1$ and $d_2$ as a function of the thickness of the protective layer system. The specific thickness of the protective layer system is then advantageously chosen to be as small as possible, but still within the reflectivity plateau. In practice, one must make sure that the minimum layer thickness is always observed for each layer, so that one can produce a closed layer.

It has been found that a standing wave field is formed by reflection at the reflective optical element, whose minimum for a protective layer thickness $d_1$ lies in the vacuum at a distance of a fraction of the operating wavelength. Now, if the layer thickness of the protective layer system is increased, the minimum of the standing wave field approaches the surface. Accordingly, the value of the standing wave field at the surface increases until the maximum is also achieved. Thus, the formation of the reflectivity plateau in dependence on the thickness of the protective layer system results because, with increasing layer thickness, the additionally created absorption, i.e., the resulting decrease in reflectivity, is compensated in that reflectivity gains are produced by increasingly constructive interference after a certain layer thickness.

As an additional effect, fewer photoelectrons are emitted near the minimum of a standing wave field. Since the photoelectrons also break down the hydrocarbons from the residual gas atmosphere into carbon or carbon-containing particles, this has the result of a noticeably slower build-up of the contamination.

A preferred embodiment is therefore characterized in that the thickness $d_1$ of the protective layer system is such that a standing wave formed by reflection at operating wavelength $\lambda_B$ has a minimum at a distance from the surface of the reflective optical element of $0.1\lambda_B$, or less. Thus, the minimum lies in the vacuum. With increasing thickness, the surface as it were migrates through the minimum until the thickness $d_2$ is reached. This corresponds to a distance from the surface to the minimum of at most $0.2\lambda_B$, and the minimum is located inside the reflective optical element.

The specification of the essentially constant curve of the reflectivity is to be understood as meaning that all reflectivity fluctuations in a region that does not limit the functional capability of the reflective optical element are considered to be constant. In an especially preferred embodiment, a reflectivity decrease of 1% of the maximum reflectivity in the protective layer thickness region between $d_1$ and $d_2$ is considered harmless and regarded as being a constant reflectivity curve in the context of this invention.

It is to be assumed that the reflectivity curve as a function of the protective layer thickness between $d_1$ and $d_2$ goes through at least one inflection point at the protective layer thickness $d_W$. For due to the partial compensation of the reflectivity loss in the protective layer thickness region between $d_1$ and $d_2$, the slope of the reflectivity curve changes in this protective layer thickness region. Advantageously, the particular thickness of the protective layer system is chosen to be $\leq d_W$. This ensures that the thickness of the protective layer corresponds to a reflectivity which lies in the region of constant reflectivity in the sense of this invention. As a result, the reflective optical element becomes insensitive to an increase in the thickness of the protective layer, for example, due to contamination.

In an especially preferred embodiment, the thickness of the protective layer system is equal to $d_1$.

The advantageous properties of the invented reflective optical element have especially positive impact when they are used in an EUV lithography appliance Especially when several reflective optical elements are connected in succession, the more uniform reflectivity and also more uniform field illumination for lengthy periods of time have especially positive impact. It has been found that even with increasing contamination the wavefront errors in the complex optical systems of EUV lithography appliances can be kept small. A major benefit consists in that fewer cleaning cycles are required for the EUV lithography appliance, thanks to the longer lifetime of the reflective optical elements. This not only reduces the down time, but also the risk of degeneration of the layer homogeneity, greater roughness of the surface, or partial destruction of the uppermost protective layer from too intense cleaning are significantly reduced. In particular, the cleaning processes for the reflective optical elements of the invention can be controlled such that the contamination layer is deliberately not entirely removed,' but rather a minimal contamination layer always remains on the uppermost layer. This protects the reflective optical element against being destroyed by too intense cleaning. The thickness of the contamination layer can be measured in traditional manner during its build-up or during the cleaning with a suitable in situ monitoring system.

It has proven to be especially advantageous for the protective layer system to consist of one or more materials from the group Ce, Be, SiO, SiC, $SiO_2$, $Si_3N_4$, C, Y, $MoSi_2$, B, $Y_2O_3$, $MoS_2$, $B_4C$, BN, $Ru_xSi_y$, Zr, Nb, MoC, $ZrO_2$, $Ru_xMo_y$, $Rh_xMo_y$, and $Rh_xSi_y$. The $SiO_2$ should preferably be amorphous or polycrystalline.

The best results are achieved with a multilayer system that consists of Mo/Si layers and that ends with the molybdenum layer on the side facing the protective layer system. Depending on the operating wavelength, multilayer system, and requirement for the reflective optical element, it can be advantageous for the protective layer system to consist of precisely two or precisely three layers.

In a preferred embodiment, the protective layer system terminates toward the vacuum with a layer of a material for which the build-up of carbon-containing substances is suppressed. It has been found that certain materials have a low affinity for carbon-containing substances, in other words, carbon-containing substances get stuck to them only with a low probability or they have a slight adsorption rate. Thus, for these materials, the build-up of carbon-containing substances is drastically reduced or suppressed. It has been found that such materials can be used as a protective layer for reflective optical elements for the EUV and soft X-ray wavelength region, without showing significant negative effects on the optical behavior of the reflective optical element. Especially preferred as such are the materials $ZrO_2$, $Y_2O_3$, and silicon dioxide in various stoichiometric relations. The silicon dioxide can be in the amorphous or polycrystalline, or possibly even the crystalline state.

In another preferred embodiment, the protective layer system terminates toward the vacuum with a layer of a material that is inert to energy deposition, that is, to bombardment with EUV protons or to external electric fields. This decreases the probability of spontaneous electron emission, which in turn might split apart the residual gases into reactive cleavage products. Hence, the deposition of contamination on the protective layer system is further reduced. One can influence the inertia to external electromagnetic fields, for example, by giving the surface the lowest possible relief and/or using materials that have a large gap between the valency band and the conduction band. Especially preferred for this are the materials Nb, BN, $B_4C$, Y, amorphous carbon, $Si_3N_4$, SiC, as well as silicon dioxide in various stoichiometric relations. The silicon dioxide can be in the amorphous or polycrystalline, or possibly even the crystalline state.

BRIEF DESCRIPTION OF THE DRAWINGS

The invention shall be explained more closely by means of several examples and the figures. These show.

DETAILED DESCRIPTION OF THE INVENTION

Figure 6A:
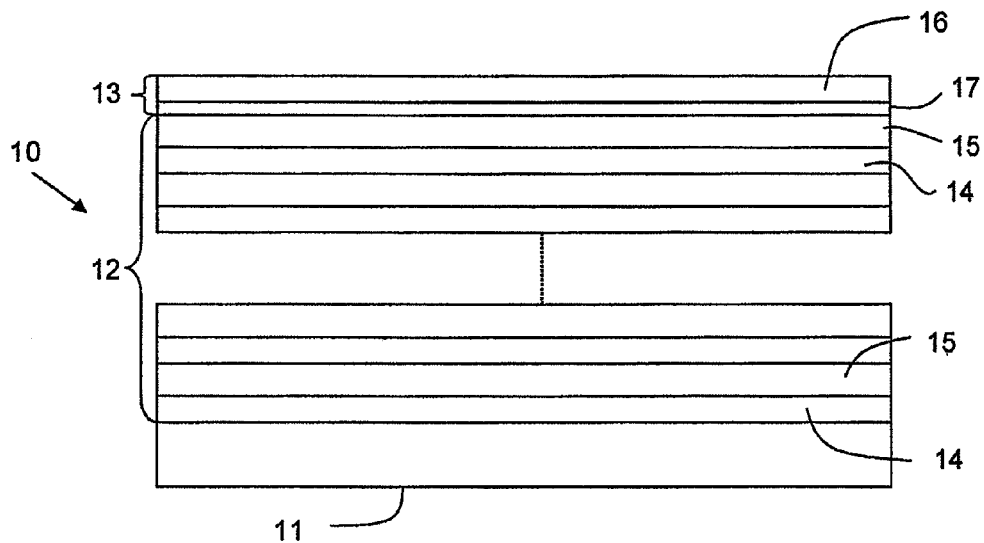
FIGS. 6a and 6b show the structure of a reflective optical element including a multilayer system and a protective layer system according to exemplary embodiments of the present invention.
Figure 6B:
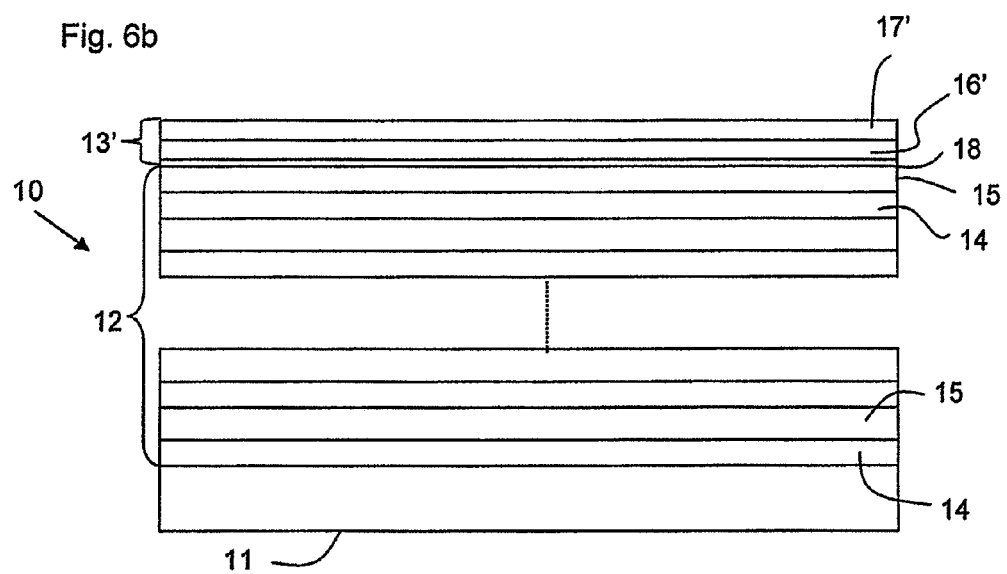

FIGS. 6a and 6b show schematically the structure of exemplary embodiments of a reflective optical element 10 for the EUV and soft X-ray wavelength region comprising a multilayer system 12 and a protective layer system 13, 13' on a substrate 11. The multilayer system 12 is made of spacer layers 14 and absorber layers 15. The multilayer system 12 terminates with an absorber layer 15 on which the protective layer system 13, 13' is arranged. In exemplary embodiments, the multilayer system 12 consists of silicon layers as spacer layers 14 and of molybdenum layers as absorber layers 15.

The protective layer system 13, 13' has at least one layer of a material with a refractive index whose real part at an operating wavelength between 12.5 nm and 15 nm is between 0.90 and 1.03, preferably between 0.95 and 1.02, and whose imaginary part at an operating wavelength between 12.5 nm and 15 nm is between 0 and 0.025, preferably between 0 and 0.015, so that the reflectivity plotted as a function of the thickness of the protective layer system 13, 13' at first drops, until a thickness $d_1$ is reached, the reflectivity remains essentially constant between thickness $d_1$ and another thickness, $d_2$, where $d_2 > d_1$, and the reflectivity further drops for a thickness $> d_2$, and the thickness of the protective layer system 13, 13' is smaller than $d_2$. The protective layer system 13, 13' consists of one or more materials from the group Ce, Be, SiO, SiC, $SiO_2$, $Si_3N_4$, C, Y, $MoSi_2$, B, $Y_2O_3$, $MoS_2$, $B_4C$, BN, $Ru_xSi_y$, Zr, Nb, MoC, $ZrO_2$, $Ru_xMo_y$, $Rh_xMo_y$, or $Rh_xSi_y$.

In exemplary embodiments of the present invention, the protective layer system 13, 13' consists of two layers 16, 17 (see FIG. 6a) or three layers 16', 17', 18 (see FIG. 6b). Advantageously, the protective layer system 13 of the example illustrated in FIG. 6a ends on a side of a vacuum, i.e. terminates with a layer 16 of a material for which the build-up of carbon is suppressed, and the protective layer system 13' of the example illustrated in FIG. 6b ends toward a side of a vacuum, i.e. terminates with a layer 17' of a material that is inert to energy deposition. It will be noted that the terminating of the protective layer system 13, 13' with a layer of a material for which the build-up of carbon is suppressed or with a layer of a material that is inert to energy deposition or with an other kind of layer is independent of the protective layer system consisting of one, two, three or more layers, as well as independent of the features of any other layers present in the protective layer system.

EXAMPLE 1

On a Mo/Si multilayer system located on a substrate of amorphous silicon dioxide, consisting of 50 pairs of 2.76 nm molybdenum and 4.14 nm amorphous silicon (a-$SiO_2$), a three-layer protective layer system is deposited. The protective layer system borders on the uppermost molybdenum layer of the multilayer system with a Y-layer 1.2 nm thick. On the Y-layer is placed a 1.5 nm $Y_2O_3$ layer. At the vacuum side, the protective layer system is closed by a 1 nm thick amorphous silicon dioxide layer. The choice of the materials and their thickness is based on the criteria of the invention. In particular, the materials are also selected so as to suppress carbon build-up ($Y_2O_3$, a-$SiO_2$) or to be inert to energy deposition (Y, a-$SiO_2$).

Figure 1:
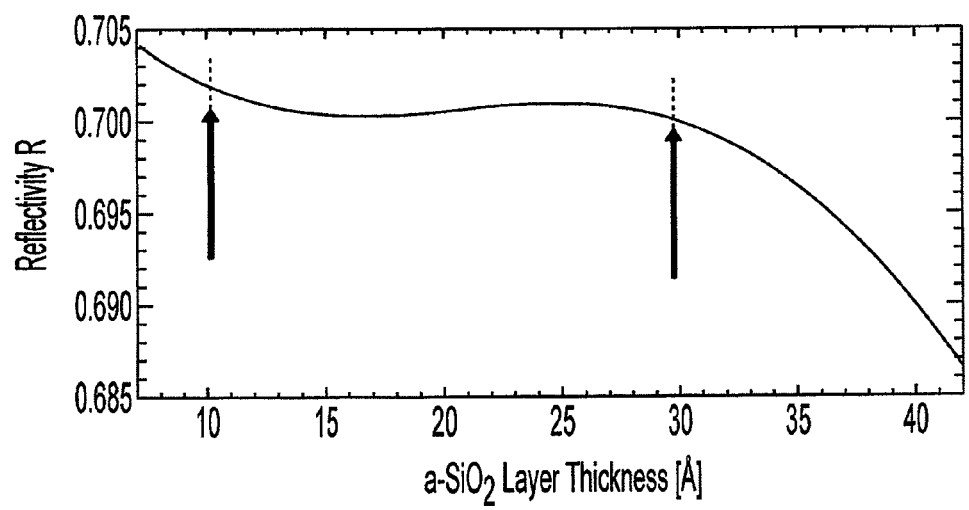
FIG. 1 shows the reflectivity of a multilayer with protective layer system as a function of the thickness of the protective layer system.

Disregarding the interface and surface roughness, one obtains a reflectivity of 70.2% at an operating wavelength of 13.5 nm for an angle of incidence of 0° with the normal to the surface. FIG. 1 shows the reflectivity of the entire reflective optical element under these conditions as a function of the thickness of the protective layer system, but holding constant the thickness of 1.2 nm for Y and 1.5 nm for $Y_2O_3$. A distinct reflectivity plateau is formed between a thickness $d_1 = 3.7$ nm and a thickness $d_2 = 6.68$ nm of the protective layer system, or an a-$SiO_2$ layer of 1 nm and 2.98 nm. Accordingly, the thickness of the silicon dioxide layer was selected to be 1.0 nm.

Figure 2A:
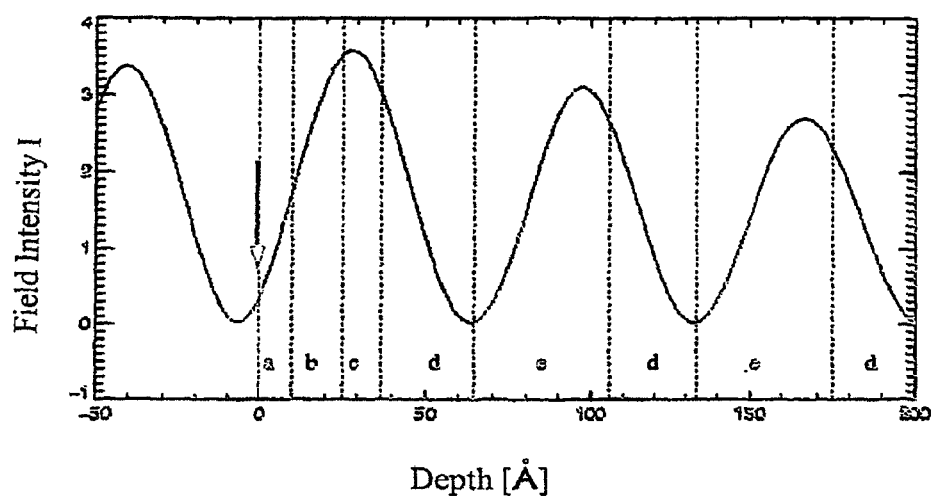
FIGS. 2a and 2b show the position of the standing wave field for different thicknesses of the protective layer system.
Figure 2B:
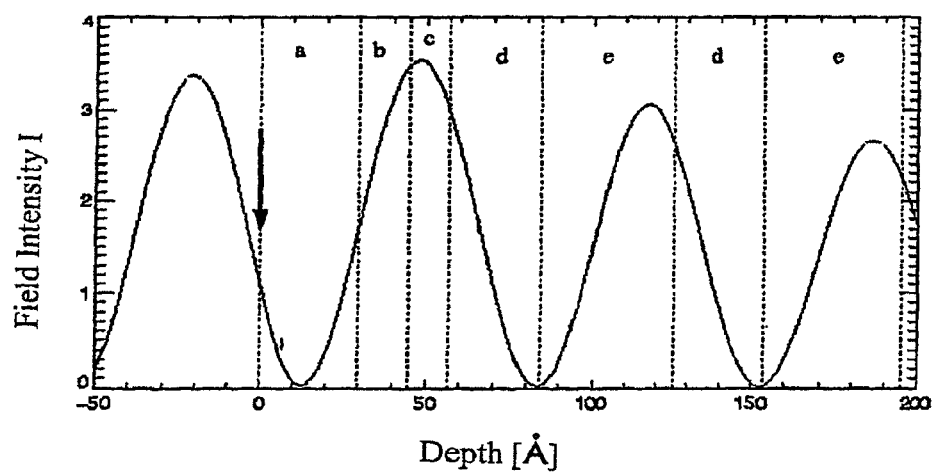

In FIGS. 2a and 2b, the resulting standing wave field is shown for a protective layer system thickness of 3.7 nm (FIG. 2a) and for a protective layer system thickness of 6.68 nm (FIG. 2b). Segments a-c corresponding to the protective layer system of amorphous $SiO_2$ (a), $Y_2O_3$ (b), and Y (c) and segments d, e corresponding to the multilayer system of molybdenum (d) and amorphous silicon (e). As can be clearly seen, with increasing thickness of the protective layer system the surface of the reflective optical element is situated in the vicinity of the minimum of the existing wave field, it migrates through the minimum, so to speak. This would suggest a slight contamination due to secondary electrons.

Figure 3:
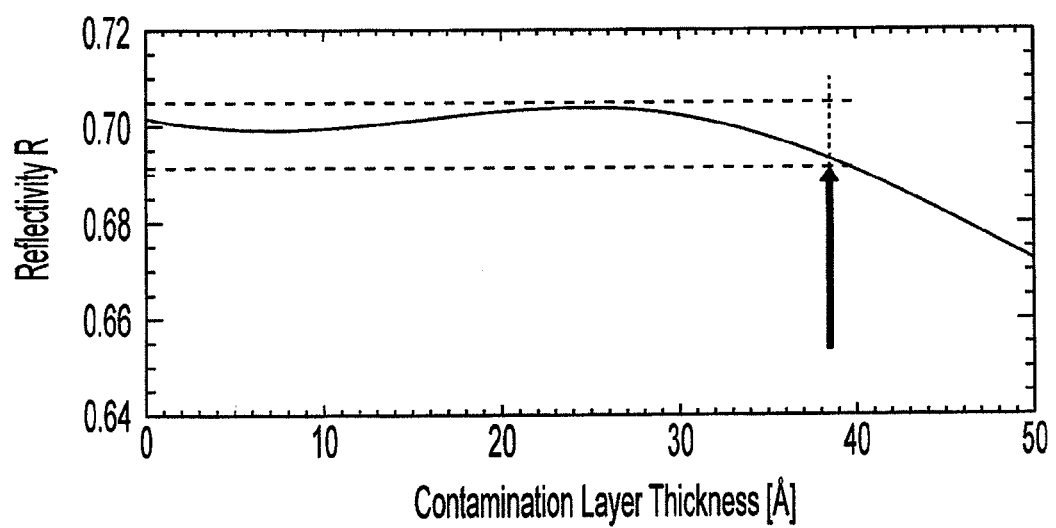
FIG. 3 shows the reflectivity of a first reflective optical element as a function of the thickness of the contamination layer.

FIG. 3 shows the reflectivity of the reflective optical element with the protective layer system of Y, $Y_2O_3$, and a-$SiO_2$ as a function of the built-up contamination layer. If one selects a tolerance range of 1% for the fluctuation in reflectivity, a carbon layer up to 4 nm thick can be tolerated without significant change in reflectivity. The operating time is therefore a multiple higher than for traditional reflective optical elements.

Figure 4A:
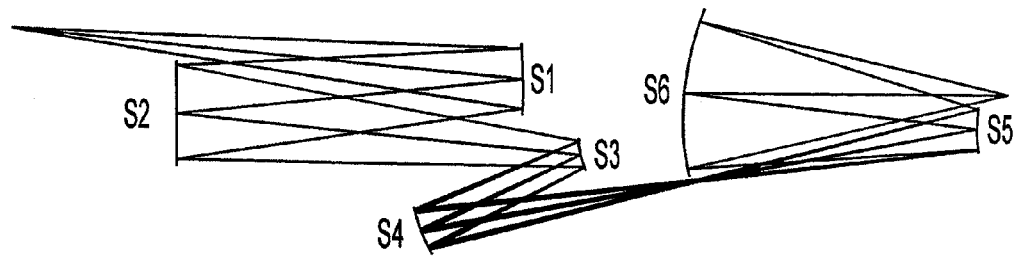
FIGS. 4a and 4b shows the dependency of the wavefront error on the thickness of the contamination layer for a six-mirror system for EUV lithography.
Figure 4B:
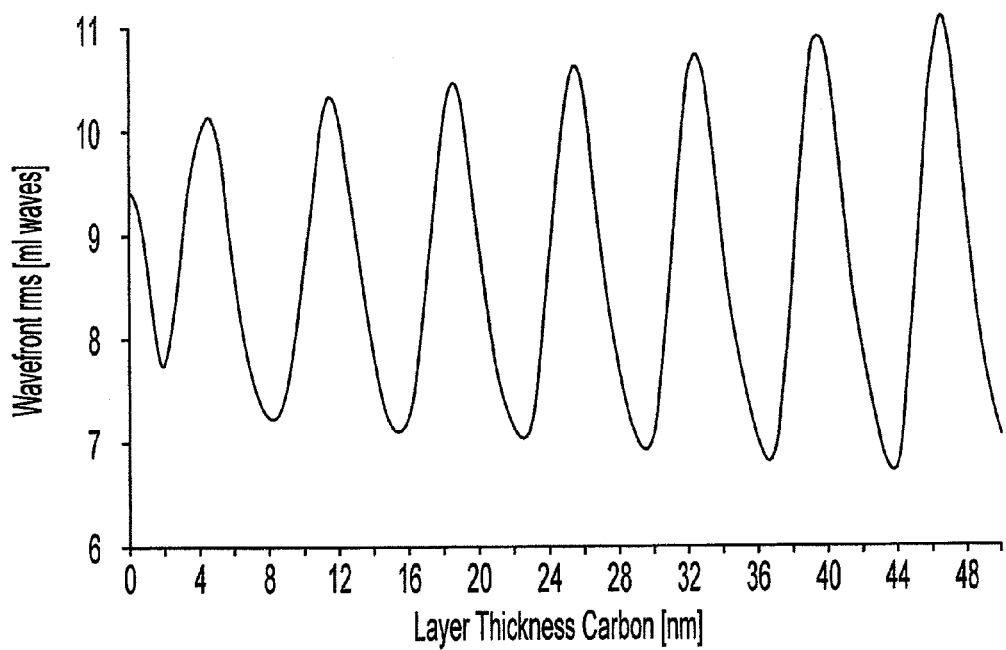

In FIGS. 4a and b, these positive results are also shown by means of an EUV lithography appliance with six reflective optical elements (S1-S6) according to the invention as mirrors. The tested mirror construction is shown in FIG. 4a. In FIG. 4b, the wavefront error is shown as a function of the carbon thickness.

Although the wavefront varies periodically with the increased carbon thickness, the absolute value of the wavefront error does not exceed a value that would significantly impair the imaging quality of the lithography system for any carbon thickness.

Because of the insensitivity of the reflective optical element discussed here with respect to the build-up of a carbon contamination layer, it is possible to only remove the contamination layer down to a layer of 0.5 nm when cleaning the reflective optical element or when cleaning the entire EUV lithography appliance. This will ensure, on the one hand, that the cleaned optical element once again has a long lifetime. But it will also make sure that the risk of degeneration of the layer homogeneity or roughening of the surface or partial destruction of the topmost layer by too intense cleaning is reduced.

EXAMPLE 2

Figure 5:
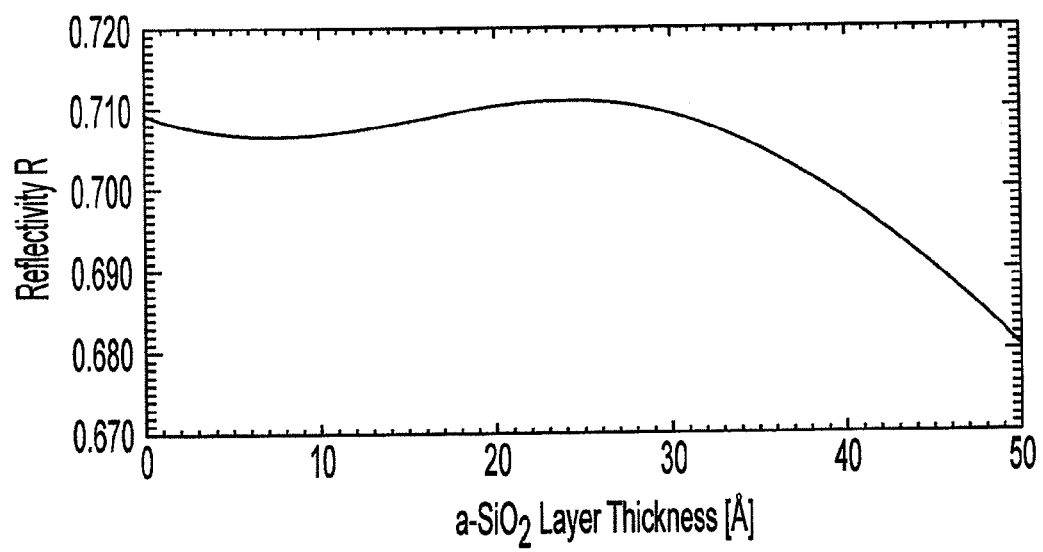
FIG. 5 shows the reflectivity of a second reflective optical element as a function of the thickness of the contamination layer.

On a multilayer system of 50 Mo/Si pairs located on an amorphous silicon dioxide substrate, optimized for an operating wavelength of 13.5 nm, a protective layer system of a 2.0 nm thick cerium layer, which adjoins the topmost molybdenum layer of the multilayer system, and a 1.5 nm thick silicon dioxide layer is placed. The minimum of a standing wave produced by reflection on the uncontaminated reflective optical element at operating wavelength $\lambda_B$ lies in the vacuum, $0.05\lambda_B$ from its surface. For a maximum reflectivity of 70.9% at an operating wavelength of 13.5 nm and a tolerated reflectivity decrease of 1%, a carbon contamination layer can tolerate a thickness of up to 3.5 nm (see FIG. 5). This reflective optical element as well is suitable for use in an EUV lithography appliance.

The above description of the preferred embodiments has been given by way of example. From the disclosure given, those skilled in the art will not only understand the present invention and its attendant advantages, but will also find apparent various changes and modifications to the structures disclosed. The applicant seeks, therefore, to cover all such changes and modifications as fall within the spirit and scope of the invention, as defined by the appended claims, and equivalents thereof.

What is claimed is:

1. A reflective optical element for the extreme ultraviolet and soft X-ray wavelength regions, comprising:
   a multilayer system,
   a protective layer system; and
   a contamination layer that changes in thickness over time during use of the reflective optical element by 2 nm or more,
   wherein the thickness over time of the contamination layer produces fluctuations in reflectivity of the reflective optical element within a tolerance range of no more than 1%.

2. The reflective optical element according to claim 1, wherein the given contamination layer thickness is approximately equal to or less than the thickness of the protective layer system.

3. The reflective optical element according to claim 1, wherein the protective layer system consists of two layers.

4. The reflective optical element according to claim 1, wherein the protective layer system consists of three layers.

5. The reflective optical element according to claim 1, wherein the protective layer system comprises one or more materials selected from the group consisting of Ce, Be, SiO, SiC, $SiO_2$, $Si_3N_4$, C, Y, $MoSi_2$, B, $Y_2O_3$, $MoS_2$, $B_4C$, BN, $Ru_xSi_y$, Zr, Nb, MoC, $ZrO_2$, $Ru_xMo_y$, $Rh_xMo_y$, and $Rh_xSi_y$.

6. The reflective optical element according to claim 1, wherein a side of the multilayer system facing the protective layer system terminates in an absorber layer.

7. The reflective optical element according to claim 1, wherein the multilayer system is a system that consists of molybdenum and silicon layers, ending with a molybdenum layer on a side facing the protective layer system.

8. The reflective optical element according to claim 1, wherein the protective layer system terminates toward a vacuum with a layer of a material for which a build-up of carbon is suppressed.

9. The reflective optical element according to claim 1, wherein the protective layer system terminates toward a vacuum with a layer of a material that is inert to energy deposition.

10. The reflective optical element according to claim 1, wherein the thickness d1 of the protective layer system is such that a standing wave formed by reflection at an operating wavelength λB has a minimum at a distance from a surface of the reflective optical element of 0.1 λB or less.

11. The reflective optical element according to claim 10, wherein the minimum lies in a vacuum.

12. An extreme ultraviolet lithography appliance with at least one reflective optical element according to claim 1.

13. A reflective optical element for the extreme ultraviolet and soft X-ray wavelength regions, the reflective optical element comprising
   a multilayer system, and
   a protective layer system, wherein:
   the protective layer system comprises at least two layers, one of the two layers terminating toward a vacuum; and
   a thickness of the protective layer system is such that a standing wave formed by reflection at an operating wavelength λB has a minimum at a distance from the surface of the reflective optical element of 0.1 λB or less, wherein the minimum lies in the vacuum.

14. The reflective optical element according to claim 13, wherein the protective layer system terminates at the vacuum side in one layer of a material with a refractive index whose real part at an operating wavelength λB between 12.5 nm and 15 nm is between 0.90 and 1.03, and whose imaginary part at an operating wavelength λB between 12.5 nm and 15 nm is between 0 and 0.025.

15. The reflective optical element according to claim 14, wherein the imaginary part is between 0 and 0.015 and the real part is between 0.95 and 1.02.

16. The reflective optical element according to claim 13, wherein a reflectivity of the reflective optical element as a function of a thickness of the layer terminating the protective system at the vacuum side drops until a first thickness value d1 is reached, the reflectivity remains essentially constant between the first thickness value d1 and a second thickness value d2, where d2>d1, and the reflectivity drops at thicknesses greater than d2.

17. The reflective optical element according to claim 16, wherein the essentially constant reflectivity comprises a reflectivity decrease of 1% or less of a maximum reflectivity at thicknesses between d1 and d2.

18. The reflective optical element according to claim 16, wherein the reflectivity as a function of the thickness of the protective layer system comprises an inflection point at a thickness dw between d1 and d2, the thickness of the protective layer system is less than dw.

19. The reflective optical element according to claim 16, wherein the thickness of the protective layer system is smaller than d2.

20. The reflective optical element according to claim 13, wherein the protective layer system comprises one or more materials selected from the group consisting of Ce, Be, SiO, SiC, SiO2, Si3N4, C, Y, MoSi2, B, Y2O3, MoS2, B4C, BN, RuxSiy, Zr, Nb, MoC, ZrO2, RuxMoy, RhxMoy, and RhxSiy.

21. The reflective optical element according to claim 13, wherein a side of the multilayer system facing the protective layer system terminates in an absorber layer.

22. The reflective optical element according to claim 13, wherein the multilayer system is a system that consists of molybdenum and silicon layers, ending with a molybdenum layer on a side facing the protective layer system.

23. The reflective optical element according to claim 13, wherein the protective layer system terminates toward a vacuum with a layer of a material for which a build-up of carbon is suppressed.

24. The reflective optical element according to claim 13, wherein the protective layer system terminates toward a vacuum with a layer of a material that is inert to energy deposition.

25. An extreme ultraviolet lithography appliance with at least one reflective optical element according to claim 13.

* * * * *

UNITED STATES PATENT AND TRADEMARK OFFICE
CERTIFICATE OF CORRECTION

PATENT NO. : 9,910,193 B2
APPLICATION NO. : 14/529515
DATED : March 6, 2018
INVENTOR(S) : Johann Trenkler, Hans-Juergen Mann and Udo Nothelfer It is certified that error appears in the above-identified patent and that said Letters Patent is hereby corrected as shown below:

In the Claims

Column 10
Lines 1-3, in Claim 20, delete "SiO2, Si3N4, C, Y, MoSi2, B, Y2O3, MoS2, B4C, BN, RuxSiy, Zr, Nb, MoC, ZrO2, RuxMoy, RhxMoy, and RhxSiy" and insert -- $SiO_2$, $Si_3N_4$, C, Y, $MoSi_2$, B, $Y_2O_3$, $MoS_2$, $B_4C$, BN, $Ru_xSi_y$, Zr, Nb, MoC, $ZrO_2$, $Ru_xMo_y$, $Rh_xMo_y$, and $Rh_xSi_y$ --

Signed and Sealed this
Fourth Day of December, 2018

Andrei Iancu
*Director of the United States Patent and Trademark Office*